(12) United States Patent
Kuo

(10) Patent No.: US 11,108,408 B2
(45) Date of Patent: Aug. 31, 2021

(54) MEMORY CONTROLLER AND METHOD OF ACCESSING FLASH MEMORY

(71) Applicant: Silicon Motion, Inc., Jhubei (TW)

(72) Inventor: Shiuan-Hao Kuo, New Taipei (TW)

(73) Assignee: SILICON MOTION, INC., Jhubei (TW)

( * ) Notice: Subject to any disclaimer, the term of this patent is extended or adjusted under 35 U.S.C. 154(b) by 56 days.

(21) Appl. No.: 16/835,906

(22) Filed: Mar. 31, 2020

(65) Prior Publication Data

US 2021/0175900 A1 Jun. 10, 2021

(30) Foreign Application Priority Data

Dec. 9, 2019 (TW) .................................. 108144852

(51) Int. Cl.
*H03M 13/00* (2006.01)
*H03M 13/11* (2006.01)
*H03M 13/15* (2006.01)
*H03M 13/29* (2006.01)

(52) U.S. Cl.
CPC .... *H03M 13/1108* (2013.01); *H03M 13/1148* (2013.01); *H03M 13/1575* (2013.01); *H03M 13/2948* (2013.01)

(58) Field of Classification Search
CPC ......... H03M 13/1108; H03M 13/1148; H03M 13/1575; H03M 13/2948
See application file for complete search history.

(56) References Cited

U.S. PATENT DOCUMENTS

| | | | | |
|---|---|---|---|---|
| 9,411,683 | B2* | 8/2016 | Kwok | H03M 13/1111 |
| 9,543,983 | B2* | 1/2017 | Tseng | H03M 13/3746 |
| 9,614,547 | B2* | 4/2017 | Fainzilber | G06F 11/1012 |
| 10,089,177 | B2* | 10/2018 | Bazarsky | H03M 13/1111 |
| 10,103,748 | B2* | 10/2018 | Hsu | H03M 13/658 |
| 10,135,464 | B2* | 11/2018 | Wang | H03M 13/1108 |
| 10,484,008 | B2* | 11/2019 | Zhang | H03M 13/1128 |
| 10,534,665 | B2* | 1/2020 | Lin | H03M 13/3746 |
| 10,547,327 | B2* | 1/2020 | Palangappa | G05B 11/42 |

* cited by examiner

*Primary Examiner* — Esaw T Abraham
(74) *Attorney, Agent, or Firm* — McClure, Qualey & Rodack, LLP

(57) ABSTRACT

A memory controller for use in a data storage device is provided. The memory controller includes a variable-node circuit and a check-node circuit. The check-node circuit is configured to obtain a codeword difference from the variable-node circuit, and calculate a syndrome according to the codeword difference. During each LDPC (low-density parity check) decoding iterative operation, the variable-node circuit executes the following steps: determining syndrome weight according to a channel value and the syndrome from the check-node circuit; obtaining a previous codeword generated by a previous LDPC decoding iterative operation; determining a flipping strategy of a bit-flipping algorithm for each codeword bit in the previous codeword according to the syndrome weight and a predetermined threshold, and flipping one or more codeword bits in the previous codeword according to the flipping strategy to generate an updated codeword; and subtracting the previous codeword from the updated codeword to generate the codeword difference.

20 Claims, 8 Drawing Sheets $$H = \begin{bmatrix} \overset{V1}{1} & \overset{V2}{1} & \overset{V3}{0} & \overset{V4}{1} & \overset{V5}{0} & \overset{V6}{1} & \overset{V7}{0} \\ 0 & 1 & 1 & 0 & 1 & 0 & 1 \\ 1 & 1 & 1 & 1 & 0 & 1 & 0 \\ 0 & 0 & 0 & 0 & 1 & 1 & 1 \end{bmatrix} \begin{matrix} C1 \\ C2 \\ C3 \\ C4 \end{matrix}$$

MEMORY CONTROLLER AND METHOD OF ACCESSING FLASH MEMORY

CROSS REFERENCE TO RELATED APPLICATIONS

This application claims priority of Taiwan Patent Application No. 108144852, file on Dec. 9, 2019, the entirety of which are incorporated by reference herein.

BACKGROUND OF THE INVENTION

Field of the Invention

The present invention relates to data accessing and, in particular, to a memory controller and a method of accessing a flash memory.

Description of the Related Art

Low-density parity check (LDPC) decoders use a linear error correcting code with parity bits. Parity bits provide a decoder with parity equations which can validate a received codeword. For example, a low-density parity check is a fixed length binary code wherein all the symbols added together will equal zero.

During encoding, all data bits are repeated and transmitted to encoders, wherein each encoder generates a parity symbol. Codewords are formed of k information digits and r check digits. If the length of the codeword is n then the information digits, k, will equal n–r. The codewords can be represented by a parity check matrix, which consists of r rows (representing equations) and n columns (representing digits). The codes are called low-density because the parity matrix will have very few '1's in comparison to the number of '0's. During decoding, each parity check is viewed as a single parity check code, and is then cross-checked with others. Decoding occurs at check nodes, and cross-checking occurs at variable nodes.

LDPC engines support three modes: hard decision hard decoding, soft decision hard decoding, and soft decision soft decoding. FIG. 1A is a diagram of a parity-check matrix H. FIG. 1B is a diagram of a Tanner Graph. As depicted in FIG. 1A, each row in the parity-check matrix H may form a check node, such as check nodes C1, C2, C3, and C4. Each column in the parity-check matrix H may form a variable node, such as variable nodes V1, V2, V3, V4, V5, V6, and V7.

The Tanner graph is another way to represent codewords, and can be used to explain some of the operation of the low-density parity check (LDPC) decoder on hard-decision soft decoding when using a bit-flipping algorithm.

As depicted in FIG. 1B, in the Tanner graph, check nodes represented by the square nodes C1 to C4 is the number of parity bits, and the variable nodes represent by the circular nodes V1 to V7 is the number of bits in a codeword. If a particular equation is related to a code symbol, the corresponding check node and variable node are represented by a line. The estimated information is passed along these lines and combined in different ways on the nodes.

When the LDPC decoding is started, the variable node will send an estimate to the check nodes on all lines, where these lines contain the bits that are considered correct. Then, each check node will perform a new estimate for each variable node according to all other connected estimates, and return the new estimated information to the variable node. The new estimation is based on: the parity check equation forces all variable nodes to a specific check node so that the sum is zero.

These variable nodes receive new estimation information and use a majority rule (i.e., a hard decision) to determine whether the value of the transmitted original bit is correct. If the value of the original bit is determined to be incorrect, the original bit will be flipped. The flipped bits are then returned to the check nodes, and the aforementioned steps are performed iteratively a predetermined number of times until the parity-check equation is satisfied (i.e., the value calculated by the check node matches the value received from the variable node), early termination can be enabled, which will cause the system to end the decoding process before the maximum iterations are reached.

The parity-check iterations are implemented by performing a syndrome check. A valid codeword will fit the equation $H \cdot C^T = S = 0$, where H denotes a parity check matrix; C denotes a hard-decision codeword; and S denotes a syndrome. When S is equal to zero, it indicates that the decoding process is complete and no further information is needed. Generally, hard decisions and syndrome checks are performed during iterations. A non-zero syndrome indicates the existence of odd parity, and a new decoding iteration is required.

For the sake of performance and low-power consumption, the conventional bit-flipping LDPC decoder often limits the data transmission of each codeword bit to one bit. That is, during each iteration, each codeword bit exchanges only the sign-bit information. Under this limitation, it is very difficult to increase the decoding performance of the decoder, such as throughput or correction rate.

BRIEF SUMMARY OF THE INVENTION

Accordingly, a memory controller and a method of accessing a flash memory are provided in the present invention, which can enable a variable-node unit in a low-density parity check decoder to execute a configurable decoding strategy, and can increase decoding performance, improve correction rate, and/or reduce power consumption.

In an exemplary embodiment, a memory controller for use in a data storage device is provided. The memory controller includes a variable-node circuit and a check-node circuit. The check-node circuit is configured to obtain a codeword difference from the variable-node circuit, and calculate a syndrome according to the codeword difference. During each LDPC (low-density parity check) decoding iterative operation, the variable-node circuit executes the following steps: determining a syndrome weight according to a channel value and the syndrome from the check-node circuit; obtaining a previous codeword generated by a previous LDPC decoding iterative operation; determining a flipping strategy of a bit-flipping algorithm for each codeword in the previous codeword according to the syndrome weight and a predetermined threshold, and flipping one or more codeword bits in the previous codeword according to the flipping strategy to generate an updated codeword; and subtracting the previous codeword from the updated codeword to generate the codeword difference.

In some embodiments, when the channel value is obtained from the flash memory using a hard-decision method, the variable-node circuit sets the channel value to the previous codeword in an initial LDPC decoding iterative operation, and sets reliability information corresponding to each codeword bit in the previous codeword to 1. Alternatively, when the channel value is obtained from the flash memory using a soft-decision method, each bit in the channel value has corresponding reliability information.

In some embodiments, the variable-node unit comprises: a flipping-determination circuit and a bit-flipping circuit. The flipping-determination circuit includes a flipping-strategy lookup table for recording the flipping strategy corresponding to different values of the syndrome weight and the predetermined threshold, wherein the flipping strategy comprises a strong-flipping strategy, a weak-flipping strategy, and a doing-nothing strategy.

In some embodiments, the bit-flipping circuit is configured to generate the updated codeword and the reliability information corresponding to each codeword bit in the updated codeword by flipping one or more codeword bits in the previous codeword and the reliability information corresponding to each codeword in the previous codeword according to the flipping strategy. The bit-flipping circuit stores the updated codeword and the reliability information corresponding to each codeword bit in the updated codeword in a variable-node memory for use by a next LDPC decoding iterative operation.

In some embodiments, a combination of each codeword bit and the reliability information in the previous codeword comprises four states: strong 1, weak 1, weak 0, and strong 0. The strong-flipping strategy indicates that a specific state of the four states is flipped to a state that has a distance of two or more steps to the specific state, and the weak-flipping strategy indicates that the specific state is flipped to a state that has a distance of one or more steps to the specific state, and the doing-nothing strategy indicates that the specific state is kept unchanged. When the syndrome weight and the predetermined threshold are greater than a predefined value and the syndrome weight is greater than or equal to the predetermined threshold, the flipping strategy corresponding to the syndrome weight and the predetermined threshold is the strong-flipping strategy In another exemplary embodiment, a method of accessing a flash memory for use in a memory controller of a data storage device is provided. The method includes the following steps: storing data to the flash memory of the data storage device via a storage program; obtaining a channel value read from the flash memory of the data storage device; obtaining a codeword difference, and calculating a syndrome according to the codeword difference; during each LDPC (low-density parity check) decoding iterative operation, performing the following steps: determining a syndrome weight according to the channel value and the syndrome from the check-node circuit; obtaining a previous codeword generated by a previous LDPC decoding iterative operation; determining a flipping strategy of a bit-flipping algorithm for each codeword in the previous codeword according to the syndrome weight and a predetermined threshold, and flipping one or more codeword bits in the previous codeword according to the flipping strategy to generate an updated codeword; and subtracting the previous codeword from the updated codeword to generate the codeword difference.

In yet another exemplary embodiment, a memory controller for use in a data storage device is provided. The memory controller includes a variable-node circuit and a check-node circuit. The check-node circuit is configured to obtain a codeword difference from the variable-node circuit, and calculate a syndrome according to the codeword difference. During each LDPC (low-density parity check) decoding iterative operation, the variable-node circuit executes the following steps: determining a syndrome weight according to the channel value and the syndrome from the check-node circuit; obtaining a previous codeword generated by a previous LDPC decoding iterative operation; determining whether each codeword bit in the previous codeword has been flipped according to the channel value and the previous codeword; selecting a first flipping-strategy lookup table and a second flipping-strategy lookup table for the codeword bits that have been flipped and the codeword bits that have not been flipped in the previous codeword, wherein the first flipping-strategy lookup table is different from the second flipping-strategy lookup table; determining a flipping strategy of a bit-flipping algorithm for each codeword in the previous codeword according to the syndrome weight, a predetermined threshold, and the selected first flipping-strategy lookup table or the second flipping-strategy lookup table, and flipping one or more codeword bits in the previous codeword according to the flipping strategy to generate an updated codeword; and subtracting the previous codeword from the updated codeword to generate the codeword difference.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figures 1A, 1B:
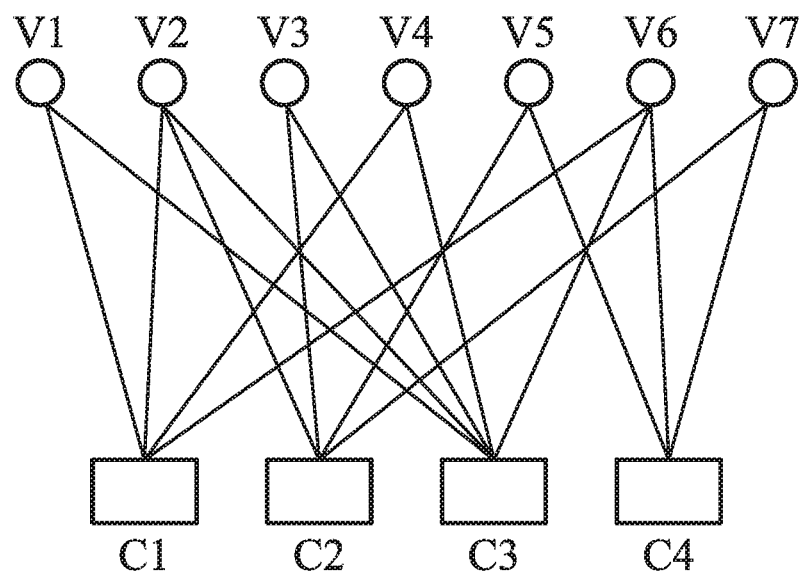
FIG. 1A is a diagram of a parity-check matrix.
FIG. 1B is a diagram of a Tanner graph.
Figure 2:
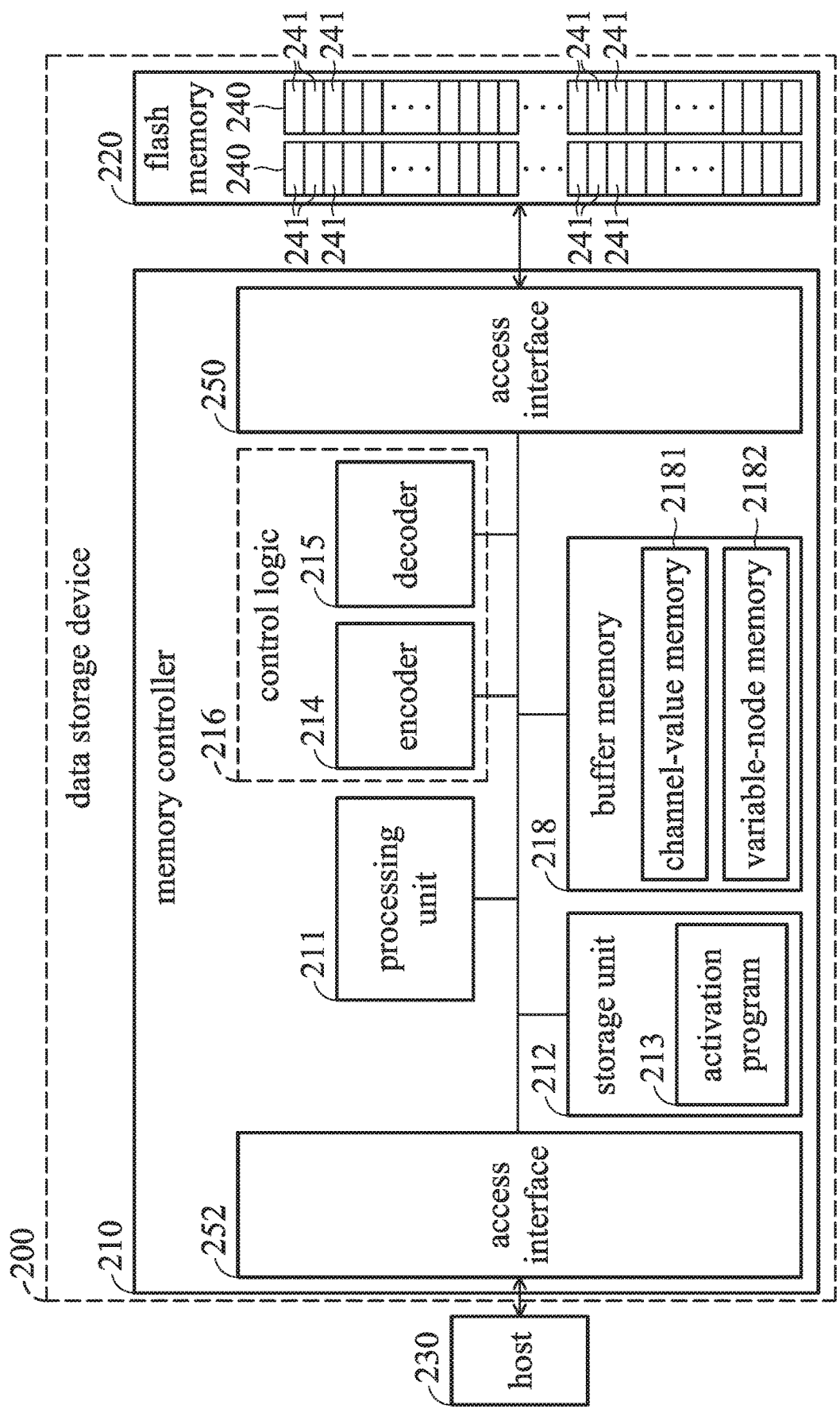
FIG. 2 is a block diagram of a data storage device in accordance with an embodiment of the invention.

FIG. 2 is a block diagram of a data storage device in accordance with an embodiment of the invention.

In an embodiment, the data storage device 200 may be a portable memory device (E.g., a memory card compatible with SD/MMC, CF, MS, XD standards) or a solid-state disk (SSD), and host 230 may be an electronic device, such as a mobile phone, a laptop computer, a desktop computer, etc., that is connected to the data storage device 200. In another embodiment, the data storage device 200 can be disposed in an electronic device such as a mobile phone, a laptop computer, or a desktop computer. At this time, the host device 230 may be a processor of the electronic device.

As depicted in FIG. 2, the data storage device 200 may include a memory controller 210 and a flash memory 220, wherein the memory controller 210 may be configured to access the flash memory 200. In an embodiment, the memory controller 210 may include a processing unit 211, a storage unit 212, a control logic 216, a buffer memory 218, and access interfaces 250 and 252. The processing unit 211 may be implemented by dedicated hardware circuits or general-purpose hardware, a processor with multiple processing cores, or a multi-processor with parallel processing capabilities, and the foregoing manner of implementation may, for example, be a general-purpose processor, or a microcontroller, but the invention is not limited thereto.

The storage unit 212 may be a non-volatile memory, such as a read-only memory (ROM), an erasable programmable read-only memory (EPROM), an electrically erasable programmable read-only memory (EEPROM), or an E-fuse. The storage unit 2121 stores an activation program that includes a boot code or a bootloader, and can be executed by the processing unit 211. The memory controller 210 completes the booting based on the activation program 213 and starts to control operations of the flash memory, such as reading an in-system programming (ISP) code.

The flash memory 220 may be a NAND flash memory, and may include a plurality of physical blocks 240, and each physical block may include a plurality of physical pages 241.

In the data storage device 200, several electrical signals are used for coordinating commands and data transfer between the processing unit 211 and the flash memory 220, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc.

The access interface 250 may communicate with the flash memory 220 using a SDR (Single Data Rate) protocol or a DDR (Double Data Rate) protocol, such as ONFI (open NAND flash interface), DDR toggle, or others. The processing unit 211 may communicate with the host 230 through an access interface 252 using a designated communication protocol, such as USB (Universal Serial Bus), ATA (Advanced Technology Attachment), SATA (Serial ATA), PCI-E (Peripheral Component Interconnect Express), NVME (Non-volatile Memory Express), or others.

The buffer memory 218 may be a volatile memory such as a dynamic random access memory (DRAM) and/or a static random access memory (SRAM). In the embodiment, the buffer memory 218 may include a channel-value memory (CHVMem) 2181, and a variable-node memory (VNMem) 2182. The channel-value memory 2181 is configured to temporarily store the original page data (i.e., can be regarded as codewords) from the flash memory 220 via the access interface 250, or temporarily store the host commands from the host 230. The variable-node memory 2182 is configured to temporarily store the variable node data of each variable node in the decoding process for low-density parity checking. In addition, the codewords stored in the channel-value memory 2181 may be information read by the flash memory 220 in a hard or soft decision. A hard decision uses a single read voltage threshold, so the resulting codeword has only sign information. A soft decision uses multiple read voltage thresholds, so the obtained codeword also carries reliability information in addition to sign information. For example, each codeword bit can be expressed by reliability information of at least one bit. If the reliability information is expressed by a single bit, 0 and 1 can be used to indicate two different reliability levels such as strong and weak, respectively. The codeword bit used together with the reliability information can be classified into four different levels of strong "1", weak "1", weak "0", and strong "0".

The control logic 216 may include an encoder 214 and a decoder 215. In some embodiments, the encoder 214, decoder 215, and control logic 216 can be implemented by application-specific integrated circuits (ASICs), field-programmable gate arrays (FPGAs), complex programmable logic device (CPLD), or logic circuits with the same function, but the invention is not limited thereto.

Figure 3:
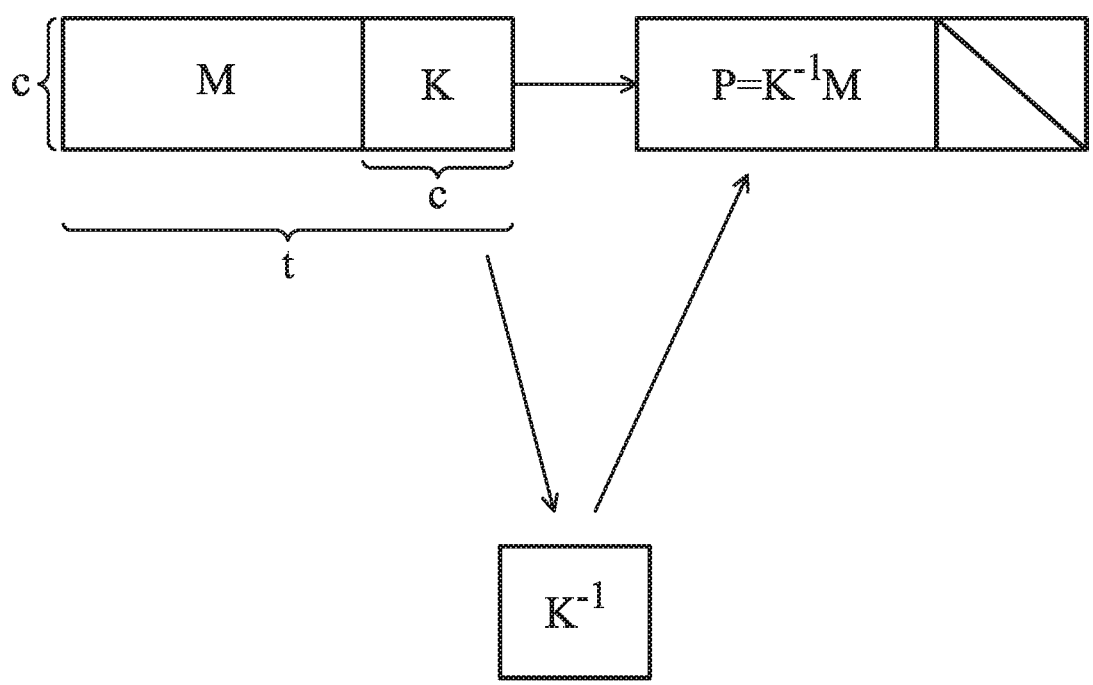
FIG. 3 is a diagram of a check-node check matrix and a check-code generation matrix.

In the embodiment, the encoder 214, for example, may be an LDPC encoder, and can generate a corresponding check code according to data from the host 230, and the generated check code conforms to a check-code check matrix. Specifically, referring to FIG. 3, it is assumed that the check-code check matrix is a matrix of size c*t (e.g., the number of rows c=5, and the number of columns t=48), and the check-code check matrix can be divided into a left-side matrix M of size c*(t−c) and a right-side matrix K of size c*c. In order to find the check-code generation matrix corresponding to the check-code check matrix, the inverse matrix $K^{-1}$ of the matrix K can be found first, and the inverse matrix $K^{-1}$ is the multiplied by the matrix M to obtain the matrix P. The transpose matrix of the matrix P can be used as the check-code generation matrix. In other words, after finding the transpose matrix of the matrix P, the encoder 214 can multiply the data from the host 230 by the transpose matrix of the matrix P to obtain the check code corresponding to the data, and then the data and the check code are multiplied by the check-code check matrix to determine whether the check code is correct. For example, if the multiplication result is equal to "0", it is determined that the encoding is correct. If the multiplication result is not equal to "0", it is determined that the encoding is incorrect. After the encoding is determined to be correct, the data and the corresponding check code will be written to one of the physical pages of the flash memory 220.

The decoder 215, for example, may be a LDPC decoder. When the host 230 sends a read command to the data storage device 230, the memory controller 210 obtains the initial page data from the flash memory 220, such as the channel value. The initial page data may include initial data and error-correction code data. Because the initial data and the error-correction code data may have errors when being transmitted through the channel, the decoder 215 may use the error-correction code data to perform error correction on the initial data and/or the error-correction code data, such as using a bit-flipping algorithm to perform LDPC decoding. The details of the decoder 215 will be described in the following embodiments.

Figure 4:
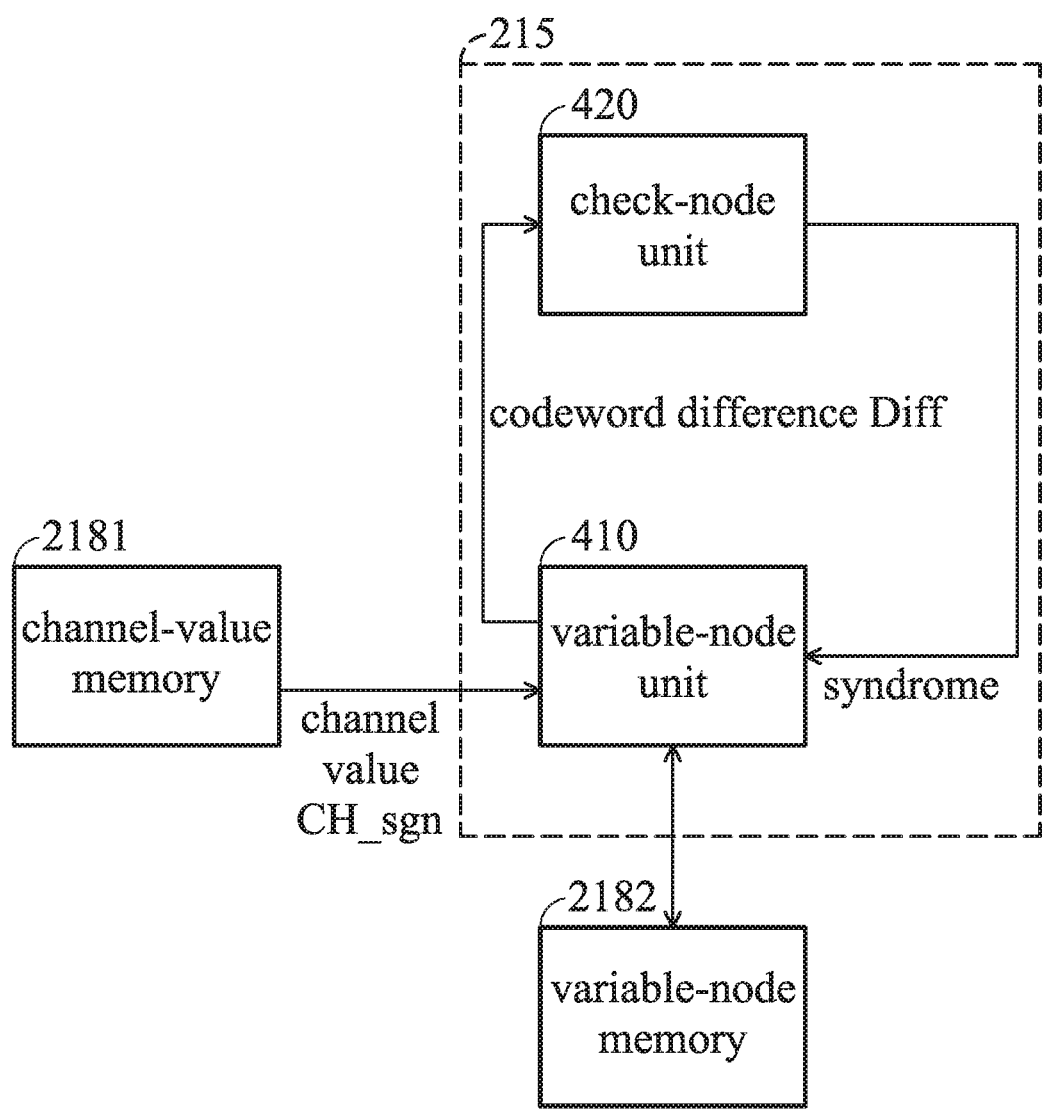
FIG. 4 is a block diagram of the decoder in accordance with an embodiment of the invention.

FIG. 4 is a block diagram of the decoder 215 in accordance with an embodiment of the invention. As depicted in FIG. 4, the decoder 215 may include a variable-node unit (VNU) 410 and a check-node unit (CNU) 420. When performing LDPC decoding, the data is iterated between the VNU 410 and CNU 420 until the correct codeword is solved or the upper limit of the number of iterations is reached. For example, when the decoder 216 starts decoding, the value of the previous codeword temporarily stored in the variable-node memory 2182 and the initial syndrome value are reset to 0. The VNU 410 obtains a channel value or a codeword (e.g., the previous codeword VN_prev) from the channel-value memory 2181 and performs the first iterative operation. The VNU 410 stores the bit-flipped updated codeword (VN_new) generated by the iterative operation in the variable-node memory 2182, and transmits the difference between the updated codeword and the previous codeword (VN_prev) to the CNU 420 to perform corresponding calculations on syndrome values.

If the syndrome value from the CNU 420 is not equal to 0, the VNU 410 will continue to perform the second or subsequent iterative operation. For example, the VNU 410 obtains the previous codeword VN_prev, the syndrome value, and the channel value from the variable-node memory 2182, the CNU 420, and the channel-value memory 2181, respectively, and calculates the previous codeword accordingly. If the syndrome value from the CNU 420 is equal to 0, the VNU 410 will output the updated codeword generated by the current iterative operation to output correct page data. Thus, the processing unit 211 of the memory controller 210 can report the correct page data to the host 230.

Figure 5:
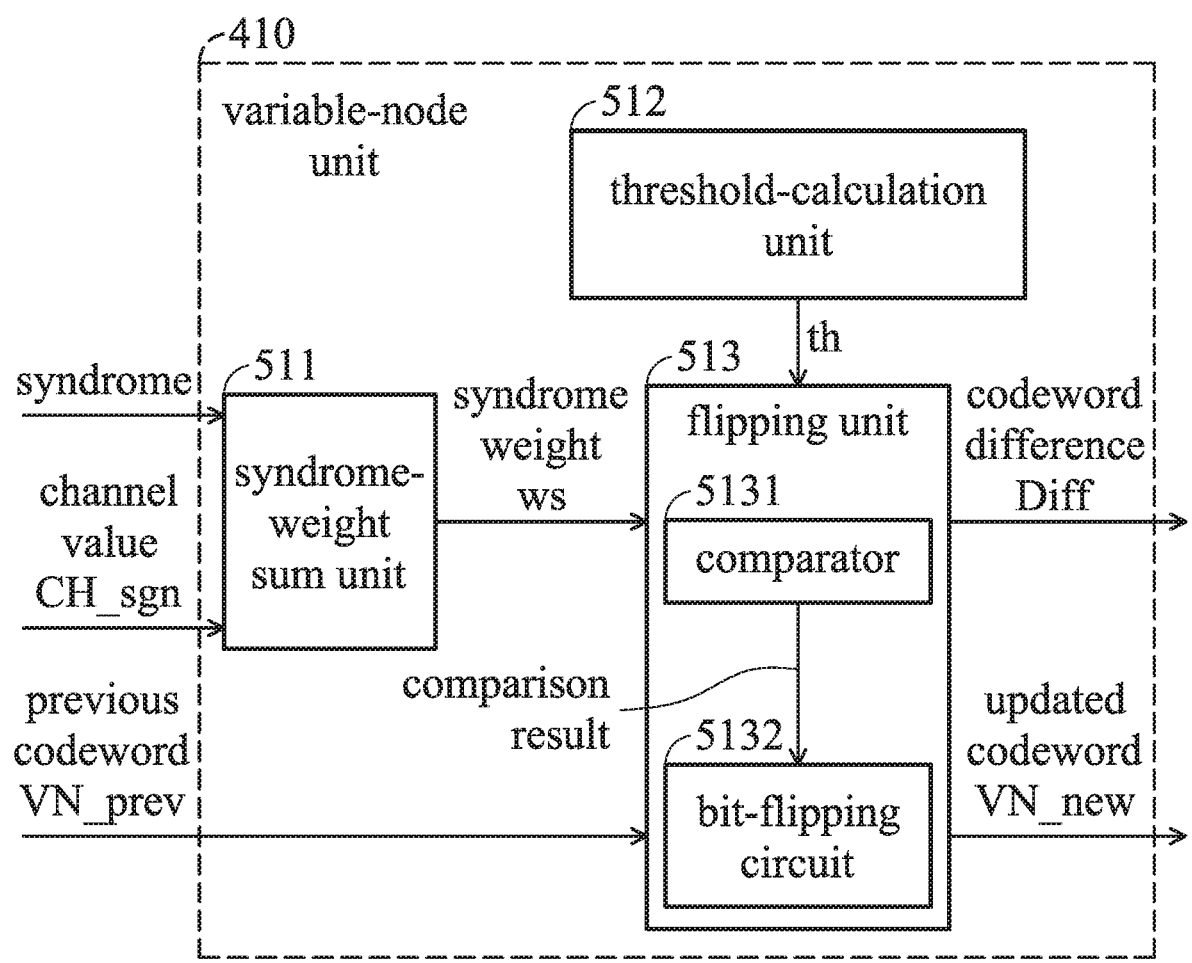
FIG. 5 is a block diagram of the variable-node unit in accordance with a first embodiment of the invention.

FIG. 5 is a block diagram of the variable-node unit in accordance with a first embodiment of the invention. Referring to FIG. 4 and FIG. 5, in the first embodiment, the VNU 410, for example, may include a syndrome-weight sum unit 511, a threshold calculation unit 512, and a flipping unit 513.

The syndrome-weight sum unit 511 is configured to generate a syndrome weight "ws" corresponding to each codeword bit according to the syndrome value "syndrome" generated from the CNU 420 and the channel value "CH_sgn" from the channel-value memory 2181.

The threshold-calculation unit 512 is configured to calculate a threshold used in the current decoding process. In the embodiment, the threshold generated by the threshold-calculation unit 512 for the decoding process may be changed according to the actual decoding situation.

The flipping unit 513 may include a comparator 5131 and a bit-flipping circuit 5132. The comparator 5131 is configured to compare the syndrome weight of each codeword bit with the threshold. The bit-flipping circuit 5132 is configured to determine whether each codeword bit should be flipped according to the corresponding comparison result, and store the bit-flipped updated codeword VN_new in the variable-node memory 2182. For example, if the syndrome weight ws of one codeword bit is greater than or equal to the threshold th, the bit-flipping circuit 5132 will flip the codeword bit, for example, from 0 to 1 or from 1 to 0. The bit-flipping circuit 5132 may calculate a codeword difference between the previous codeword and the updated codeword obtained in the current iterative operation, and transmit the codeword difference Diff to the CNU 420.

The calculation method of the codeword difference is, for example, VN_next−VN_prev. Both the updated codeword and the previous codeword are binary numbers. If the updated codeword VN_next is 0111 and the previous codeword VN_prev is 0101, the codeword difference Diff is 0010.

Figure 6A:
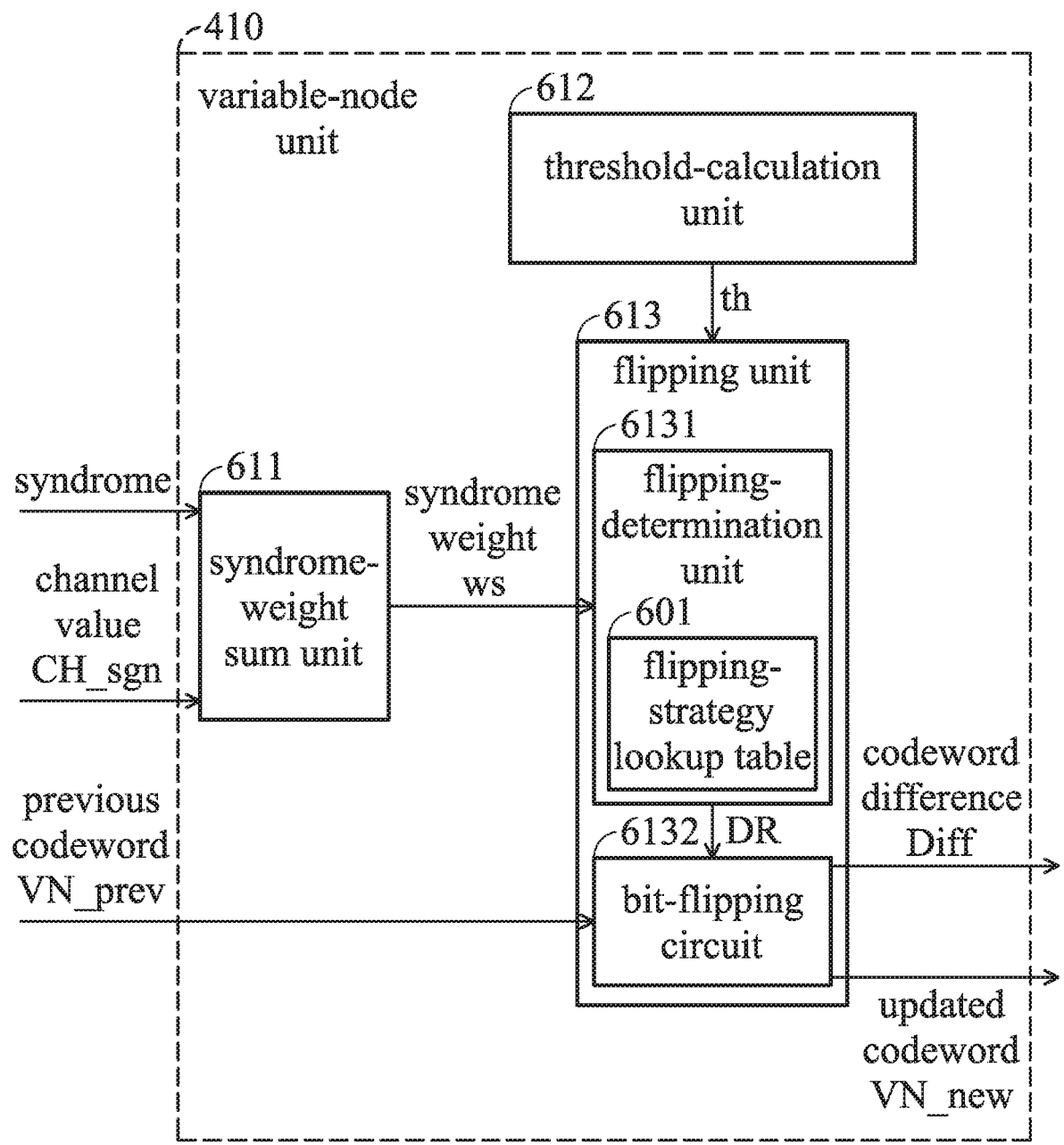
FIG. 6A is a block diagram of the variable-node unit in accordance with a second embodiment of the invention.

FIG. 6A is a block diagram of the variable-node unit in accordance with a second embodiment of the invention. Referring to both FIG. 4 and FIG. 6A, in the second embodiment, the VNU 410, for example, may include a syndrome-weight sum unit 611, a threshold-calculation unit 612, and a flipping unit 613.

The syndrome-weight sum unit 611 is configured to generate a syndrome weight "ws" corresponding to each codeword bit according to the syndrome value "syndrome" generated from the CNU 420 and the channel value "CH_sgn" from the channel-value memory 2181. The threshold-calculation unit 612 is configured to calculate a threshold used in the current decoding process. In the embodiment, the threshold generated by the threshold-calculation unit 512 for the decoding process may be a fixed value.

The flipping unit 613 may include a flipping-determination unit 6131 and a bit-flipping circuit 6132. The flipping-determination unit 6131 is configured to determine a flipping strategy according to the syndrome weight ws and the threshold corresponding to each codeword bit. For convenience of explanation, the flipping-determination unit 6131, for example, may be implemented by a flipping-strategy lookup table 601, wherein the flipping-strategy lookup table 601 can be pre-stored in the storage unit 212, and the processing unit 211 can load the flipping-strategy lookup table 601 to the buffer memory 218 or a register file when the data storage device 200 is powered on.

In an embodiment, the flipping-strategy lookup table 601 may be looked up using hard information with a codeword or soft information with a codeword. For example, for a normal flash memory, the error rate is less than 1%, which means that the accuracy of the data is very high, so it is suitable to use hard decisions to read the page data. If the hard decision is used when reading the page data of the flash memory 220, it means that the channel value or codeword stored in the channel-value memory 2181 does not carry reliability information. At this time, when the flipping unit 613 starts to perform LDPC decoding, the reliability information (e.g., can be expressed by one or more bits) corresponding to each codeword bit from the channel-value memory 2181 can be reset to 1. With the iterative operation during the decoding process, if the reliability information is 1 bit, the value of each codeword bit and the corresponding reliability information may be switched to different values, such as strong 1, weak 1, weak 0, and strong 0, where strong/weak indicates reliability information, and the four combinations of (reliability, codeword bit) can be expressed as (1, 1), (0, 1), (0, 0), and (1, 0) or expressed as S1, W1, W0, and S0, respectively.

In another embodiment, the VNU 410 in FIG. 6 may also receive page data that is read using soft decision (e.g., using multiple read voltage thresholds to read the flash memory 220), and the codeword from the channel-value memory 2181 may carry the soft information, such as the reliability information of one or more bits. At this time, when the flipping unit 613 starts to perform LDPC decoding, each codeword bit and corresponding reliability information from the channel-value memory 2181 can be directly used.

In the embodiment, the lookup results of the flipping-strategy lookup table 601 using the syndrome weight ws and threshold th can be divided into different bit-flipping methods, such as "strong flip", "weak flip", and "do nothing". The syndrome weight ws and threshold th are natural numbers, but the invention is not limited thereto.

For example, the bit-flipping methods of "strong flip", "weak flip", and "do nothing" can be expressed by S, W, and X, respectively. If the lookup result indicates a strong flip S, the strong "0" will be flipped to a weak "1", and the weak "0" will be flipped to a strong "1", and the weak "1" will be flipped to a strong "0", and the strong "1" will be flipped to the weak "0". If the table lookup result indicates a weak flip S, the strong "0" will be flipped to the weak "0", and the weak "0" will be flipped to the weak "1", and the weak "1" will be flipped to the weak "0", and the strong "1" will be flipped to the weak "1". If the lookup result indicates "do nothing", the strong "1", weak "1", weak "0" and strong "0" will be kept at their original values.

The manner of flipping employed by the strong flip, weak flip, and do nothing are shown in Table 1:

TABLE 1

| Strong Flip | Weak Flip | Do Nothing |
|---|---|---|
| S0 → W1 | S0 → W0 | S0 → S0 |
| W0 → S1 | W0 → W1 | W0 → W0 |
| W1 → S0 | W1 → W0 | W1 → W1 |
| S1 → W0 | S1 → W1 | S1 → S1 |

Figure 6B:
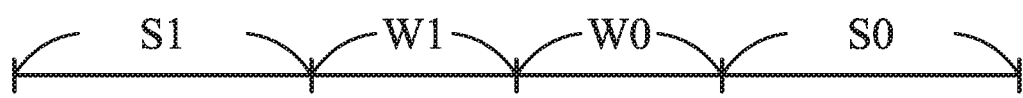
FIG. 6B is a diagram of the logical states of the flipping strategy in accordance with the second embodiment of the invention.

It should be noted that the present invention is not limited to the flipping methods and numbers shown in Table 1, and those having ordinary skill in the art can design suitable flipping methods and numbers according to actual conditions. It should be noted that S1, W1, W0, and S0 are regarded as four logical states arranged in sequence, and there is a difference of one step between two adjacent logical states, as shown in FIG. 6B. The "strong flip" method may indicate that the current state will be flipped to a state having a distance of two or more steps, such as state S1 being flipped to state W0, state S0 being flipped to state W1, and so on. The "weak flip" method may indicate that the current state will be flipped to a state having a distance of one step, such as state S1 being flipped to state W1, state S0 being flipped to state W0, and so on. However, whether it is a strong flip or weak flip, states S1, W1, W0, and S0 will have symmetry when they are flipped, as shown in Table 1.

In an embodiment, if the syndrome weight ws and the threshold th are both integers ranging from 0 to 4, the flipping-strategy lookup table 601 can be expressed by Table 2 to indicate flipping strategies corresponding to different syndrome weight ws and threshold th:

TABLE 2

| | th | | | | |
|---|---|---|---|---|---|
| ws | 0 | 1 | 2 | 3 | 4 |
| 0 | X | X | W | W | W |
| 1 | X | X | X | W | W |
| 2 | X | X | X | W | W |
| 3 | X | X | X | W | S |
| 4 | X | X | X | X | S |

For example, the flipping-strategy lookup table 601 can be designed to improve throughput. When the values of the syndrome weight ws and the threshold th are larger, it indicates that the error probability in the codeword bits is higher, so a strong flipping method is used.

In some embodiments, the flipping-determination unit 6131 may include a plurality of flipping-strategy lookup tables 6131. Different flipping-strategy lookup tables correspond to different decoding targets, and can be optimized for design, such as improving the throughput, increasing the correction rate, or reducing power consumption, etc. When the decoder 215 is set to one of the decoding targets, the flipping-determination unit 6131 may select one of the flipping-strategy lookup tables corresponding to the decoding target.

For example, the flipping-strategy lookup table for improving the throughput can be an overall more aggressive flipping strategy with a smaller number of iterations. When the decoder 215 is under the same hardware parallelism, the flipping-strategy lookup table for improving the throughput can double the hard decoding throughput. The flipping-strategy lookup table for improving the correction rate can use a neutral flipping strategy with a greater number of iterations in order to make error corrections for codewords with more errors, such as an additional raw bit error rate (RBER) of 0.05% can be increased under the same correction rate. The flipping-strategy lookup table for reducing power consumption can use a more conservative flipping strategy with a smaller number of iterations, and thus the power consumption of the decoder 215 can be reduced under the same hardware parallelism. In some embodiments, some flipping-strategy lookup tables in the flipping-determination unit 6131 can be designed for two or more decoding targets, such as improving the throughput and correct rate at the same time, but the invention is not limited thereto. In addition, compared with FIG. 5, the decoder 215 using the VNU 410 in FIG. 6 has better decoding performance.

The bit-flipping circuit 6132 may determine whether each codeword bit and its reliability information R should be flipped according to the lookup result corresponding to each codeword bit, and store the bit-flipped updated codeword and updated reliability information R_new in the variable-node memory 2182. The bit-flipping circuit 6132 may calculate the codeword difference Diff between the previous codeword and the updated codeword obtained in the current iterative operation, such as VN_next−VN_prev, and transmit the codeword difference Diff to the CNU 420. It should be noted that the bit-flipping circuit 6132 transmits the codeword difference to the CNU 420, but does not transmit the updated reliability information R_new to the CNU 420, but instead updates the reliability information R_new stored in the variable-node memory 2182 for the next iterative operation.

Figure 7:
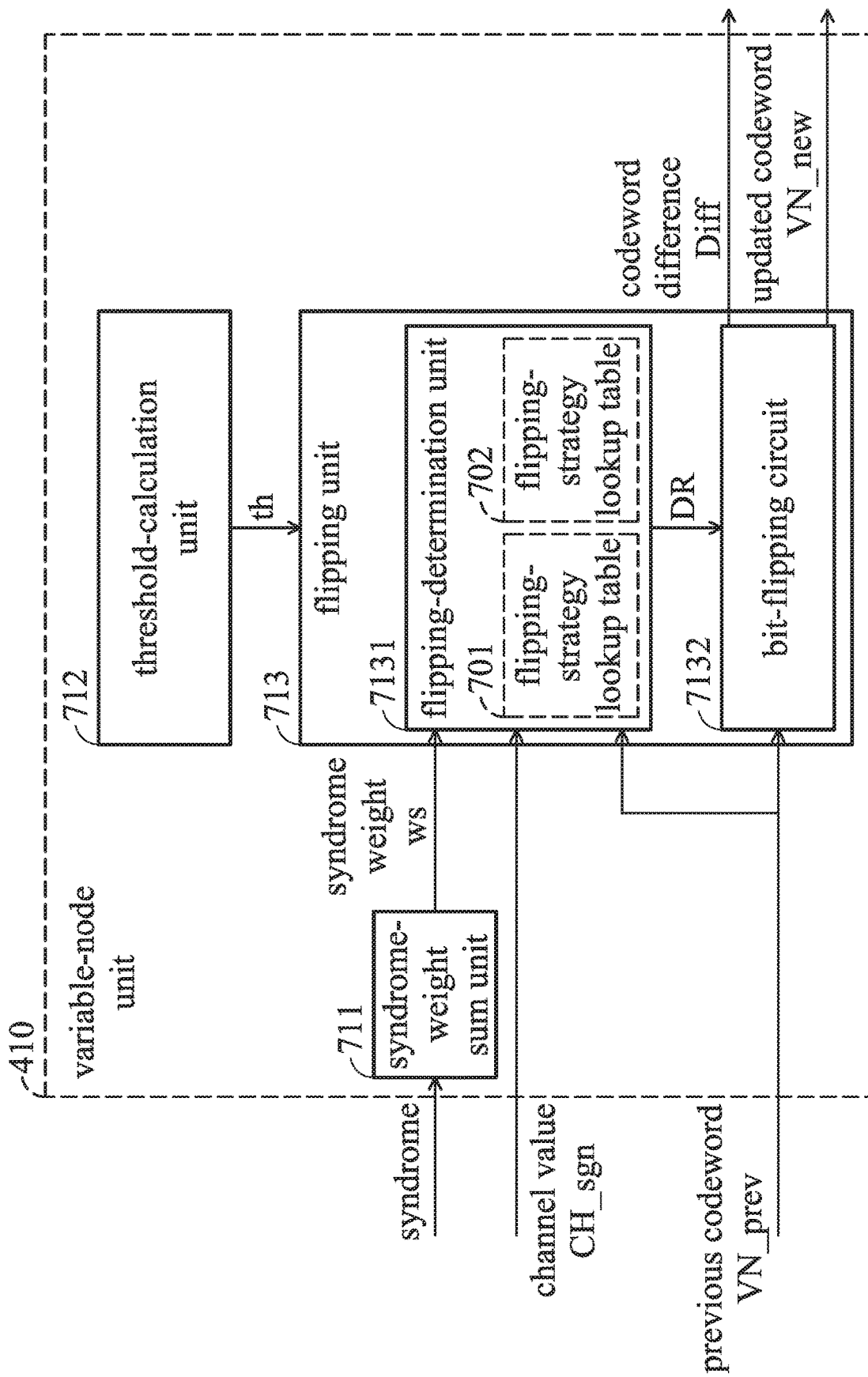
FIG. 7 is a block diagram of the variable-node unit in accordance with a third embodiment of the invention.

FIG. 7 is a block diagram of the variable-node unit in accordance with a third embodiment of the invention. Referring to both FIG. 4 and FIG. 7, in the third embodiment, the VNU 410, for example, may include a syndrome-weight sum unit 711, a threshold-calculation unit 712, and a flipping unit 713. The calculation method of the syndrome-weight sum unit 711 in FIG. 7 is different from that of the syndrome-weight sum unit 611 in FIG. 6A. For example, the syndrome-weight sum unit 711 is configured to generate a syndrome weight ws corresponding to each codeword bit according to the syndrome generated from the CNU 420. The Threshold-calculation unit 712 is configured to calculate a threshold used in the current decoding process. In the embodiment, the threshold generated by the threshold-calculation unit 712 for the decoding process may be a fixed value, but the threshold is not necessarily the same for each decoding iteration process.

The flipping unit 713 may include a flipping-determination unit 6131 and a bit-flipping circuit 7132. The flipping-determination unit 7131 may include flipping-strategy lookup tables 701 and 702 that have different flipping strategies. The flipping-strategy lookup tables 701 and 702 can be pre-stored in the storage unit 212, and the processing unit 211 can load the flipping-strategy lookup tables 701 and 702 into the buffer memory 218 or a register file when the data storage device 200 is powered on.

The flipping-determination unit 7131 may determine whether to select one of the flipping-strategy lookup tables 701 and 702 according to the channel value CH_sgn from the channel-value memory 2181 and the previous codeword VN_prev from the variable-node memory 2182. After selecting one of the flipping-strategy lookup tables 701 and 702, the flipping-determination unit 7131 can determine the corresponding flipping strategy according to the syndrome weight ws and the threshold th corresponding to each codeword bit.

Specifically, the channel value CH_sgn and the previous codeword VN_prev have the same length, and both include a plurality of bits. The channel value CH_sgn can be regarded as the original codeword. Because the previous codeword VN_prev in the current iterative operation (e.g., the iterative operation N) is the bit-flipped updated codeword VN_new generated from the previous codeword VN_prev in the previous iterative operation (e.g., iterative operation N−1) performed by the VNU 410. Accordingly, the channel value CH_sgn and the previous codeword VN_prev obtained in the current iterative operation can be used to determine which codeword bits in the original codeword have been flipped.

It should be noted that, for the normal flash memory 220, the data error rate is below 1%, so the probability that each codeword bit in the channel value CH_sgn is the correct bit is relatively high. Therefore, for codeword bits that have not been flipped in the previous codeword VN_prev, the flipping-determination unit 7131 uses the flipping-strategy lookup table 701 to determine the flipping strategy according to the syndrome weight ws and the threshold th corresponding to each codeword bit, wherein the flipping-strategy lookup table 701 is shown in Table 3. For the codeword bits that have been flipped in the previous codeword VN_prev, the flipping-determination unit 7131 uses the flipping-strategy lookup table 702 to determine the flipping strategy according to the syndrome weight ws and the threshold th corresponding to each codeword bit, wherein the flipping-strategy lookup table 702 is shown in Table 4.

TABLE 3

| ws | th 0 | 1 | 2 | 3 | 4 |
|---|---|---|---|---|---|
| 0 | X | W | W | W | W |
| 1 | X | W | W | W | W |
| 2 | X | X | W | W | W |
| 3 | X | X | X | W | S |
| 4 | X | X | X | W | S |

TABLE 4

| ws | th 0 | 1 | 2 | 3 | 4 |
|---|---|---|---|---|---|
| 0 | X | X | W | W | W |
| 1 | X | X | X | W | W |
| 2 | X | X | X | X | W |

TABLE 4-continued

| ws | th 0 | 1 | 2 | 3 | 4 |
|---|---|---|---|---|---|
| 3 | X | X | X | X | W |
| 4 | X | X | X | X | S |

In the embodiment, the flipping strategy used in flipping-strategy lookup table 702 is more conservative than the one used in flipping-strategy lookup table 701, and this indicates that there are fewer flipping steps used by the flipping strategy in flipping-strategy lookup table 702 than in flipping-strategy lookup table 701. For example, for a normal flash memory 220 with a very low data error rate, the probability that the codeword bits in the original codeword (e.g., the channel value) read from the flash memory 220 are incorrect is very low. In this situation, some codeword bits are still bit-flipped by the VNU 410, and this indicates that the corresponding syndrome weights ws of these codeword bits may be high. If a more aggressive flipping strategy is used such as the aforementioned strong-flipping method, it may have a greater chance to flip the codeword bits into actually incorrect codeword bits. At this time, the incorrectly-flipped codeword bits can be corrected by more iterative operations, which means that the penalty of the flipping errors is also higher, so a more conservative flipping strategy is used on the codeword bits that have been flipped, such as the aforementioned weak-flipping method or doing nothing.

The bit-flipping circuit 7132 may determine whether each codeword bit and its reliability information R should be flipped according to the lookup result DR corresponding to each codeword bit, and store the bit-flipped updated codeword VN_new and updated reliability information R_new in the variable-node memory 2182. The bit-flipping circuit 7132 may calculate the codeword difference Diff between the previous codeword and the updated codeword obtained in the current iterative operation, such as VN_next−VN_prev, and transmit the codeword difference Diff to the CNU 420. It should be noted that the bit-flipping circuit 7132 transmits the codeword difference Diff to the CNU 420, but does not transmit the updated reliability information R_new to the CNU 420, but instead updates the reliability information R_new into the variable-node memory 2182 for the next iterative operation.

In some embodiments, the function of the syndrome-weight sum unit 711 in FIG. 7 is similar to that of the syndrome-weight sum unit 611 in FIG. 6, and the syndrome-weight sum unit 711 may generate the syndrome weight ws corresponding to each codeword bit according to the syndrome from the CNU 420 and the channel value CH_sgn from the channel-value memory 2181.

In addition, the embodiments of FIGS. 6 and 7 can also be implemented in combination. For example, different flipping-strategy lookup tables can be selected for different decoding goals of the decoder 215 in FIG. 6, such as improving the throughput, improving the correction rate, or reducing power consumption. After adding the design of the embodiment of FIG. 7, different flipping-strategy lookup tables in FIG. 6 can be subdivided into a first flipping-strategy lookup table for the codeword bits that have not been flipped yet, and a second flipping strategy lookup table for the codeword bits that have been flipped. Accordingly, the aforementioned implementation can further increase the performance of the decoder 215.

Figure 8:
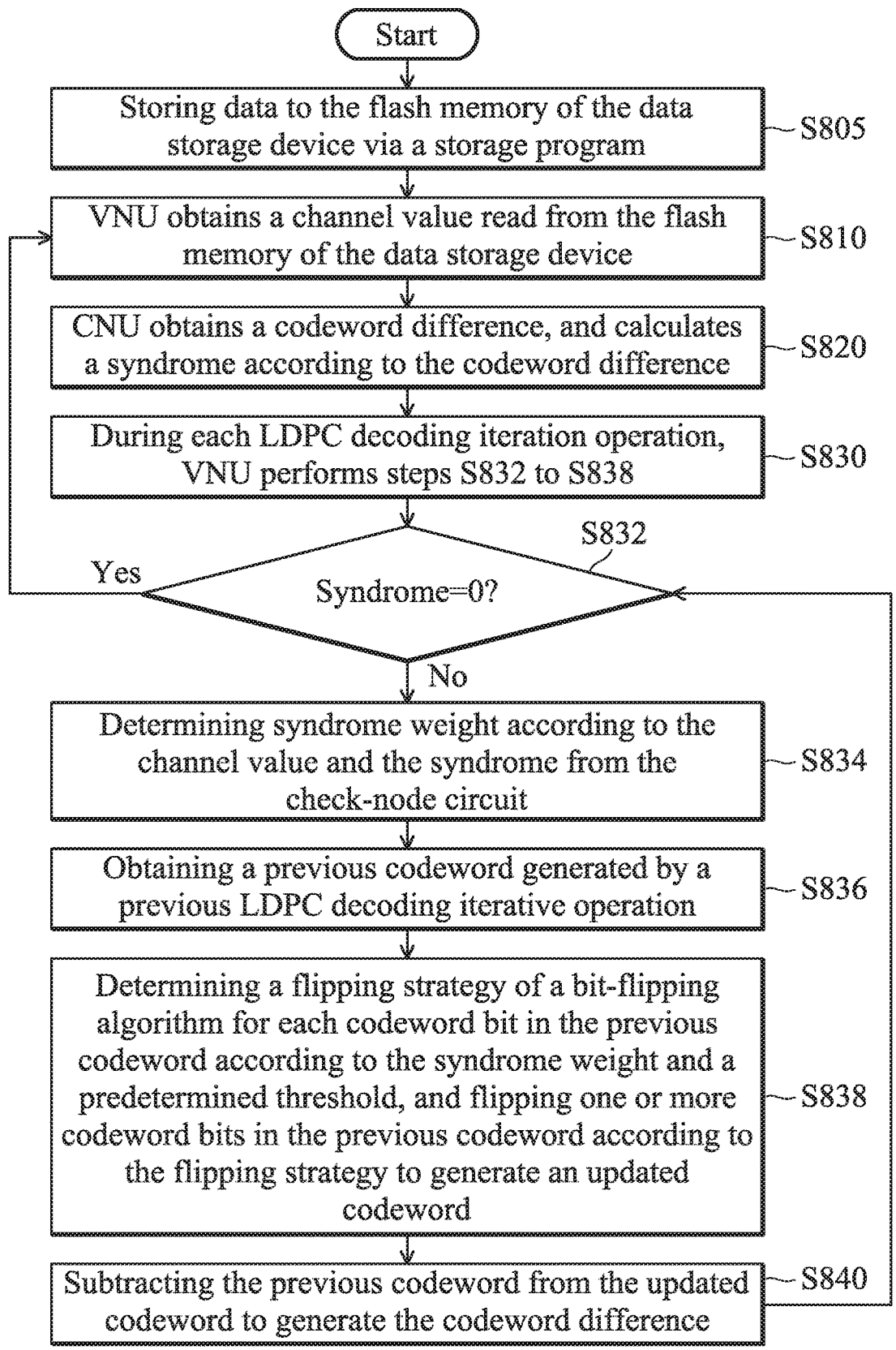
FIG. 8 is a flow chart of a method of accessing a flash memory in accordance with an embodiment of the invention.

FIG. 8 is a flow chart of a method of accessing a flash memory in accordance with an embodiment of the invention. Referring to FIG. 2 and FIG. 8, the flow of the method of accessing the flash memory are described below. For example, the method of accessing the flash memory in FIG. 8 may use a strategy-based bit-flipping LDPC decoding method when reading data from the flash memory 220.

In step S805, the data is stored into the flash memory 220 of the data storage device 200 via a storage program. For example, the storage program may indicate that the data to be stored to the data storage device 200 by the host 230 is encoded by an encoding process (e.g., LDPC encoding process), and the encoded data is written to the flash memory 220.

In step S810, the VNU 410 obtains a channel value read from the flash memory 220 of the data storage device 200. For example, starting from step S810, the decoding process for the memory controller 210 to read data from the flash memory 220 is performed, and the decoding process is relative to the encoding process described above.

In step S820, the CNU 420 obtains a codeword difference from the VNU 410, and calculates a syndrome according to the codeword difference.

In step S830, during each LDPC decoding iterative operation, the VNU 410 performs steps S832 to S840.

In step S832, it is determined whether the syndrome generated by the CNU 420 is equal to 0. If the syndrome is equal to 0, the decoding process ends. If the syndrome is not equal to 0, step S834 is performed.

In step S834, a syndrome weight is determined according to the channel value and the syndrome from the CNU, wherein each codeword bit in the previous codeword has a corresponding syndrome weight.

In step S836, a previous codeword generated by a previous LDPC decoding iterative operation is obtained. For example, the updated codeword generated by the previous iterative operation is the previous codeword used in the current iterative operation.

In step S838, a flipping strategy of a bit-flipping algorithm for each codeword bit in the previous codeword is determined according to the corresponding syndrome and a predetermined threshold, and an updated codeword is generated by flipping one or more codeword bits in the previous codeword. For example, the flipping-determination unit 6131 may include a flipping-strategy lookup table 601 for recording flipping strategies corresponding to different values of the syndrome weights and the threshold, wherein the flipping strategies may include a strong-flipping strategy, a weak-flipping strategy, and a doing-nothing strategy, but the invention is not limited thereto.

In step S840, a codeword difference is generated by subtracting the previous codeword from the updated codeword. It should be noted that during the aforementioned bit-flipping process, the reliability information of each codeword bit is considered together and the bit-flipping is performed according to the flipping strategy. However, after the bit-flipping circuit 6132 generates the codeword difference by subtracting the previous codeword from the updated codeword, the bit-flipping circuit 6132 transmits the codeword difference to the CNU 420, but does not transmit the reliability information to the CNU 420. The bit-flipping circuit 6132 stores the reliability information corresponding to each codeword bit in the updated codeword in the variable-node memory 2182.

In view of the above, a memory controller and a method of accessing a flash memory are provided in the invention. The memory controller and the method are capable of controlling the variable-node unit in a LDPC decoder using bit-flipping to execute a configurable decoding strategy that can be set for different decoding goals of the decoder, such as improving the throughput, improving the correction rate, or reducing power consumption. In addition, the variable-node unit in the decoder can select a suitable flipping-strategy lookup table for codeword bits that have been flipped and codeword that have not been flipped, thereby improving the decoding performance.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory controller, for use in a data storage device, the memory controller comprising:
   a variable-node circuit, configured to obtain a channel value read from a flash memory of the data storage device; and
   a check-node circuit, configured to obtain a codeword difference from the variable-node circuit, and to calculate a syndrome according to the codeword difference,
   wherein during each LDPC (low-density parity check) decoding iterative operation, the variable-node circuit executes the following steps:
      determining a syndrome weight according to the channel value and the syndrome from the check-node circuit;
      obtaining a previous codeword generated by a previous LDPC decoding iterative operation;
      determining a flipping strategy of a bit-flipping algorithm for each codeword bit in the previous codeword according to the syndrome weight and a predetermined threshold, and flipping one or more codeword bits in the previous codeword according to the flipping strategy to generate an updated codeword; and
      subtracting the previous codeword from the updated codeword to generate the codeword difference.

2. The memory controller as claimed in claim 1, wherein when the channel value is obtained from the flash memory using a hard-decision method, the variable-node circuit sets the channel value to the previous codeword in an initial LDPC decoding iterative operation, and sets reliability information corresponding to each codeword bit in the previous codeword to 1.

3. The memory controller as claimed in claim 1, wherein when the channel value is obtained from the flash memory using a soft-decision method, each bit in the channel value has corresponding reliability information.

4. The memory controller as claimed in claim 2, wherein the variable-node circuit comprises:
   a flipping-determination circuit, comprising a flipping-strategy lookup table for recording the flipping strategy corresponding to different values of the syndrome weight and the predetermined threshold, wherein the flipping strategy comprises a strong-flipping strategy, a weak-flipping strategy, and a doing-nothing strategy; and
   a bit-flipping circuit, configured to generate the updated codeword and the reliability information corresponding to each codeword bit in the updated codeword by flipping one or more codeword bits in the previous codeword and the reliability information corresponding to each codeword in the previous codeword according to the flipping strategy.

5. The memory controller as claimed in claim 4, wherein the bit-flipping circuit further stores the updated codeword and the reliability information corresponding to each codeword bit in the updated codeword in a variable-node memory for use by a next LDPC decoding iterative operation.

6. The memory controller as claimed in claim 4, wherein a combination of each codeword bit and the reliability information in the previous codeword comprises four states: strong 1, weak 1, weak 0, and strong 0,
wherein the strong-flipping strategy indicates that a specific state of the four states is flipped to a state that has a distance of two or more steps to the specific state, and the weak-flipping strategy indicates that the specific state is flipped to a state that has a distance of one or more steps to the specific state, and the doing-nothing strategy indicates that the specific state is kept unchanged.

7. The memory controller as claimed in claim 6, wherein when the syndrome weight and the predetermined threshold are greater than a predefined value and the syndrome weight is greater than or equal to the predetermined threshold, the flipping strategy corresponding to the syndrome weight and the predetermined threshold is the strong-flipping strategy.

8. A method of accessing a flash memory, for use in a memory controller of a data storage device, the method comprising:
storing data to the flash memory of the data storage device via a storage program;
obtaining a channel value read from the flash memory of the data storage device;
obtaining a codeword difference, and calculating a syndrome according to the codeword difference,
during each LDPC (low-density parity check) decoding iterative operation, performing the following steps:
determining a syndrome weight according to the channel value and the syndrome from the check-node circuit;
obtaining a previous codeword generated by a previous LDPC decoding iterative operation;
determining a flipping strategy of a bit-flipping algorithm for each codeword bit in the previous codeword according to the syndrome weight and a predetermined threshold, and flipping one or more codeword bits in the previous codeword according to the flipping strategy to generate an updated codeword; and
subtracting the previous codeword from the updated codeword to generate the codeword difference.

9. The method as claimed in claim 8, further comprising:
when the channel value is obtained from the flash memory using a hard-decision method, setting the channel value to the previous codeword in an initial LDPC decoding iterative operation, and setting reliability information corresponding to each codeword bit in the previous codeword to 1.

10. The method as claimed in claim 8, wherein when the channel value is obtained from the flash memory using a soft-decision method, each bit in the channel value has corresponding reliability information.

11. The method as claimed in claim 9, further comprising:
building a flipping-strategy lookup table for recording the flipping strategy corresponding to different values of the syndrome weight and the predetermined threshold, wherein the flipping strategy comprises a strong-flipping strategy, a weak-flipping strategy, and a doing-nothing strategy; and
generating the updated codeword and the reliability information corresponding to each codeword bit in the updated codeword by flipping one or more codeword bits in the previous codeword and the reliability information corresponding to each codeword in the previous codeword according to the flipping strategy.

12. The method as claimed in claim 11, further comprising:
storing the updated codeword and the reliability information corresponding to each codeword bit in the updated codeword in a variable-node memory for use by a next LDPC decoding iterative operation.

13. The method as claimed in claim 11, wherein a combination of each codeword bit and the reliability information in the previous codeword comprises four states: strong 1, weak 1, weak 0, and strong 0,
wherein the strong-flipping strategy indicates that a specific state of the four states is flipped to a state that has a distance of two or more steps to the specific state, and the weak-flipping strategy indicates that the specific state is flipped to a state that has a distance of one or more steps to the specific state, and the doing-nothing strategy indicates that the specific state is kept unchanged.

14. The method as claimed in claim 13, wherein when the syndrome weight and the predetermined threshold are greater than a predefined value and the syndrome weight is greater than or equal to the predetermined threshold, the flipping strategy corresponding to the syndrome weight and the predetermined threshold is the strong-flipping strategy.

15. A memory controller, for use in a data storage device, the memory controller comprising:
a variable-node circuit, configured to obtain a channel value read from a flash memory of the data storage device; and
a check-node circuit, configured to obtain a codeword difference from the variable-node circuit, and to calculate a syndrome according to the codeword difference,
wherein during each LDPC (low-density parity check) decoding iterative operation, the variable-node circuit executes the following steps:
determining a syndrome weight according to the channel value and the syndrome from the check-node circuit;
obtaining a previous codeword generated by a previous LDPC decoding iterative operation;
determining whether each codeword bit in the previous codeword has been flipped according to the channel value and the previous codeword;
selecting a first flipping-strategy lookup table and a second flipping-strategy lookup table for the codeword bits that have been flipped and the codeword bits that have not been flipped in the previous codeword, wherein the first flipping-strategy lookup table is different from the second flipping-strategy lookup table;
determining a flipping strategy of a bit-flipping algorithm for each codeword bit in the previous codeword according to the syndrome weight, a predetermined threshold, and the selected first flipping-strategy lookup table or the second flipping-strategy lookup table, and flipping one or more codeword bits in the previous codeword according to the flipping strategy to generate an updated codeword; and subtracting the previous codeword from the updated codeword to generate the codeword difference.

16. The memory controller as claimed in claim 15, wherein when the channel value is obtained from the flash memory using a hard-decision method, the variable-node circuit sets the channel value to the previous codeword in an initial LDPC decoding iterative operation, and sets reliability information corresponding to each codeword bit in the previous codeword to 1.

17. The memory controller as claimed in claim 16, wherein the variable-node unit comprises:

a flipping-determination circuit, comprising the first flipping-strategy lookup table and the second flipping-strategy lookup table for recording the flipping strategy corresponding to different values of the syndrome weight and the predetermined threshold, wherein the flipping strategy comprises a strong-flipping strategy, a weak-flipping strategy, and a doing-nothing strategy; and a bit-flipping circuit, configured to generate the updated codeword and the reliability information corresponding to each codeword bit in the updated codeword by flipping one or more codeword bits in the previous codeword and the reliability information corresponding to each codeword in the previous codeword according to the flipping strategy.

18. The memory controller as claimed in claim 17, wherein the bit-flipping circuit further stores the updated codeword and the reliability information corresponding to each codeword bit in the updated codeword in a variable-node memory for use by a next LDPC decoding iterative operation.

19. The memory controller as claimed in claim 17, wherein a combination of each codeword bit and the reliability information in the previous codeword comprises four states: strong 1, weak 1, weak 0, and strong 0, wherein the strong-flipping strategy indicates that a specific state of the four states is flipped to a state that has a distance of two or more steps to the specific state, and the weak-flipping strategy indicates that the specific state is flipped to a state that has a distance of one or more steps to the specific state, and the doing-nothing strategy indicates that the specific state is kept unchanged.

20. The memory controller as claimed in claim 19, wherein an overall flipping step of the flipping strategy used in the second flipping-strategy lookup table is less than that of the flipping strategy used in the first flipping-strategy lookup table.

\* \* \* \* \*